United States Patent [19]

Carney et al.

[11] Patent Number: 4,581,749
[45] Date of Patent: Apr. 8, 1986

[54] DATA FREQUENCY MODULATOR WITH DEVIATION CONTROL

[75] Inventors: Scott N. Carney, Hoffman Estates; Steven H. Goode; Donald L. Linder, both of Palatine, all of Ill.

[73] Assignee: Motorola, Inc., Schaumburg, Ill.

[21] Appl. No.: 627,158

[22] Filed: Jul. 2, 1984

[51] Int. Cl.[4] ............................................. H03C 3/06
[52] U.S. Cl. ...................................... 375/44; 455/44; 332/19
[58] Field of Search ....................... 375/44, 45, 51, 52, 375/57, 64; 455/44; 332/16 R, 19

[56] References Cited

U.S. PATENT DOCUMENTS

| | | | |
|---|---|---|---|
| 2,977,417 | 3/1961 | Doelz et al. | 370/45 |
| 3,327,216 | 6/1967 | Sichak | 455/44 |
| 3,729,678 | 4/1973 | Glasbergen et al. | 455/44 |
| 3,787,775 | 1/1974 | Lanning | 329/122 |
| 3,866,122 | 2/1975 | Baer et al. | 455/44 |
| 3,938,045 | 2/1976 | Mathwich | 375/64 |
| 3,993,868 | 11/1976 | Balcewicz | 375/47 |
| 4,063,197 | 12/1977 | Dreher | 332/16 R |
| 4,066,841 | 1/1978 | Young | 375/49 |
| 4,229,821 | 10/1980 | de Jager et al. | 375/53 |
| 4,486,782 | 12/1984 | Bretl et al. | 332/19 |

OTHER PUBLICATIONS

"Tamed Frequency Modulation, A Novel Method to Achieve Spectrum Economy in Digital Transmission"; De Jager and Dekker; IEEE Transactions on Communications; vol. COM-26, No. 5, May 1978.
"A Study of Modulation for Digital Mobile Telephony"; Hirade and Muroto; 29th IEEE Vehicular Technology Conference; Mar. 1979.
The Frequency Shifting Synthesizer; Warwick, Prescott, Gosling; The Radio Electronic Engineer; vol. 50, No. 3; Mar. 1980.
Understanding PSK Demodulation Techniques; Steber; Microwave & RF; Apr. 1984.

Primary Examiner—Robert L. Griffin
Assistant Examiner—Raymond C. Glenny
Attorney, Agent, or Firm—James W. Gillman; Raymond A. Jenski

[57] ABSTRACT

An automatic deviation control circuit for an angle modulated data transmitter is disclosed wherein the deviation level of modulated data is controlled by a modulation cancelling deviation error detection feedback loop. After the modulation is cancelled from a sample of modulated carrier by a predetermined value of deviation, residual modulation is detected, sampled following a predetermined number of like-level data bits, and applied to the modulation path gain to increase or decrease the deviation such that the residual modulation is minimized.

11 Claims, 9 Drawing Figures

DATA FREQUENCY MODULATOR WITH DEVIATION CONTROL

BACKGROUND OF THE INVENTION

This invention generally refers to modulation control circuits and more specifically to deviation control circuits for digital frequency or phase modulated transmitters useful in narrow band land mobile communications frequencies.

The channels available for land mobile communications are typically spaced 25 KHz or 30 KHz apart in the UHF and VHF bands such that the transmissions from one transmitter do not interfere with the transmissions of a transmitter on an adjacent channel. Generally, frequency (or phase) modulation is used on these channels to convey analog information such as voice from a transmitter to a receiver. It is also desirable to transmit data over the same channels. However, when high bit rate signals are modulated onto a radio frequency (RF) carrier, a radio spectrum much wider than that produced by analog signals is generated. This wide spectrum overlaps or splatters energy into adjacent channels and can result in poor system sensitivity for a receiver tuned to the adjacent channel. Therefore, in order to avoid splatter it is the task of a transmitter modulator to frequency translate a digital baseband signal to a radio frequency signal such that the modulation energy in a 10 KHz wide channel centered 25 KHz from the RF carrier of the signal is at least 60 dB below the level of the carrier. It is also desirable that the digital baseband signal be as high a bit rate as possible.

Several different modulation techniques have been employed for narrow bandwidth transmissions. One type is offset quadrature phase shift keying (OQPSK) which instantaneously shifts the phase of the carrier by zero or plus or minus pi divided by two radians for each bit time. The pulse shape at the frequency modulator input is an impulse containing the exact area necessary to cause a pi divided by two phase shift and which results in an effectively infinite frequency deviation and unacceptably wide transmitted sprectrum. A second form of data modulation is called minimum shift keying (MSK) which modulates the carrier by instantaneouly shifting the carrier frequency. A digital 1 is represented by a positive shift in frequency such that the carrier phase changes by a positive pi divided 2 radians during the period of the bit time and a digital zero is represented by a negative shift in carrier phase such that the phase changes by a negative pi divided by two radians during the bit time. The pulse shape presented to the input of a frequency modulator is rectangular and does not present impulses generating a wide frequency spectrum. However, when the data changes polarity the second derivative of the waveform at that point results in impulses which cause unacceptably wide transmitter deviations. A third modulation technique is called sinusoidal frequency shift keying (SFSK) which is an attempt to eliminate the second derivative impulses present with MSK. SFSK accomplishes this by sinusoidally shaping the phase waveform input to the frequency modulator during each bit time rather than using the linear phase path of MSK. The SFSK phase path is smooth at the points where the data bit changes polarity and allows higher derivatives of the carrier phase waveform to exist without impulse responses. However, because the SFSK waveform shaping occurs during a bit time, the peak instaneous deviation is twice as large as MSK and the modulation frequency is changed even when the data polarity does not change. Therefore, a wide spectrum is created with SFSK.

Two types of modulation techniques, tamed frequency modulation (TFM) and premodulation Gaussian-filtered spectrum-manipulated minimum shift keying (GMSK), can result in reduced spectrum occupancy with high data bit rate. This bandwidth reduction is accomplished by allowing some interference between neighboring pulses in a precisely defined manner. In the case of TFM, the total phase change of the carrier during a bit time is determined by applying a correlation coding function which is also known as a partial response coding. These functions code a serial binary bit stream into a serial stream of multilevel symbols. The coding function used in TFM codes three consecutive binary digits into a five level bit stream which is modulated into different carrier phase changes over one symbol period. GMSK utilizes a precisely defined Gaussian filter prior to the input of the frequency modulator thereby reducing the spectrum occupancy of the modulated carrier while retaining enough information such that individual bits may be recovered at the receiver.

These last two modulation techniques, however, require that the carrier frequency and the modulation sensitivity be invariant. In realizable systems these parameters are insufficiently constant and require special measures to be taken to keep them at the prescribed values. For example, the modulation sensitivity should be maintained within ±2% of the design value. Several techniques have been suggested in the literature to overcome the modulation sensitivity instability problem. One such technique uses a phase locked loop which feeds back the square of the modulated data signal and locks to the two spectral lines which are a result of the squaring operation. A second uses a ROM look up table followed by a D-A converter which produces quadrature carrier signals which are subsequently fed to a quadrature modulator to produce the modulated signal. A third requires periodic calibration of a discriminator with carriers at the appropriate peak deviation. During transmission, the discriminator output is monitored and the modulator input level is adjusted to provide the proper deviation.

Each of these ways of solving the modulation sensitivity instability problem requires either a special relationship between frequencies of modulation, or added complexity of circuit in a quadrature modulator, or an added burden of calibration. The modulation cancellation and detection approach of the present invention avoids these problems and yields stable modulation sensitivity.

SUMMARY OF THE INVENTION

Therefore, it is an object of the present invention to automatically maintain a constant deviation for transmission of data signals.

It is a further object of the present invention to avoid the complexity of quadrature modulators and look up tables.

It is a further object of the present invention to remove the burden of discriminator calibration and calibration maintenance.

Accordingly these and other objects are achieved in the automatic deviation control circuit of the present invention. This automatic deviation control circuit includes an angle modulator which modulates the radio carrier or a precursor of the radio carrier (such as a subharmonic of the carrier frequency which subsequently is multiplied in conventional fashion to realize the carrier frequency) to a deviation amount proportional to the data input level. This deviation amount is compared to a predetermined positive deviation frequency value when the input data bit is at one binary level and is compared to a predetermined negative deviation frequency value when the data bit is at the second binary level, thus revealing differences in the carrier deviation amount and a predetermined postive or negative deviation value when the data bit is at a one or zero level. Furthermore, when a predetermined number of consecutive like-level data bits is detected, the positive deviation difference is sampled if the consecutive bits are of one value or the negative deviation difference is sampled if the consecutive bits are of the other binary value. The proportionality of the radio carrier deviation value to the data input level is varied in response to the amount of each sample.

DETAILED DESCRIPTION OF THE PREFERRED EMBODIMENT

Figure 1:
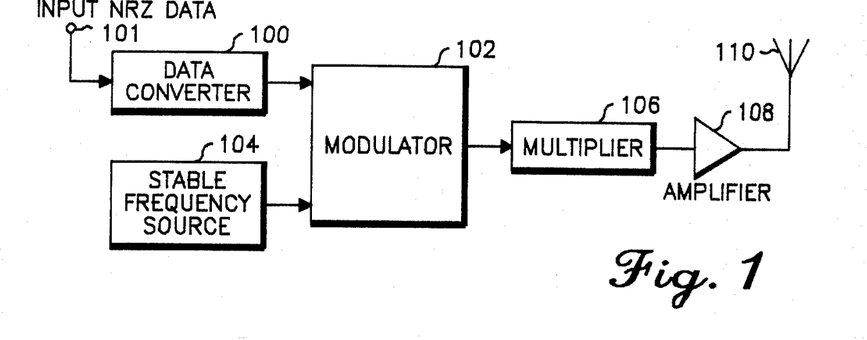
FIG. 1 is a block diagram of a typical data modulated frequency or phase modulated transmitter which includes the present invention incorporated in modulator 102.

A simplified transmitter block diagram is shown in FIG. 1 and is of a configuration well known to those skilled in the art. In this instance, a filtered data stream is generated by the data converter 100 in response to an input NRZ data bit stream 101. This filtered data stream along with the associated clock is passed to the modulator 102 where it is modulated with a signal which is referenced to a stable frequency source 104. The modulated signal may then be coupled to a frequency multiplier 106 and then to an amplifier 108 for transmission via antenna 110.

Figure 2:
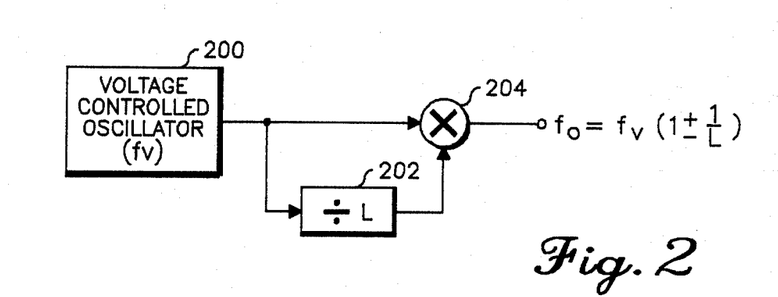
FIG. 2 is a simplified block diagram of a conventional frequency shift synthesizer.

In order to detect the deviation level and provide information to a deviation control loop, a precise detection method is required. A discriminator will demodulate the deviation but is of little use unless the deviation recovery is known exactly and does not vary. The present invention avoids the recovery problems by means of modulation cancellation employing a frequency shifting synthesizer (FSS). This well known digital frequency synthesizer has been found useful in applications where high frequency-resolution is required. The basic frequency shift synthesizer is shown in FIG. 2. This synthesizer consists of a radio frequency source such as a voltage controlled oscillator (VCO) 200 of frequency $f_v$ which has its output split into two paths. One of the split outputs is divided by a large number L as shown in divider 202 and the divided signal is recombined with the second output signal path in a mixer 204. The resultant frequency, $f_o$, will equal the frequency of the VCO plus or minus the frequency of the VCO divided by L, or:

$$f_o = f_v \pm \frac{f_v}{L} = f_v(1 \pm 1/L)$$

Figure 3:
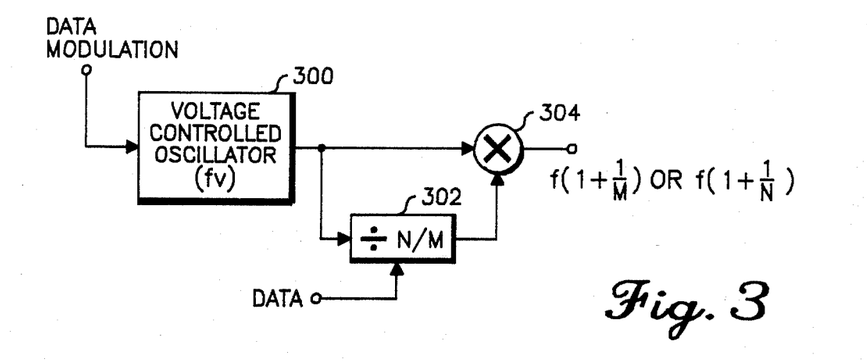
FIG. 3 is a block diagram of the frequency shift synthesizer of FIG. 2 wherein the divider is a dual modulus divider under control of the input data and showing sum term output.

The small incremental additive term ($f_v/L$) can be set, with proper choices of $f_v$ and L to be equal to the maximum instantaneous frequency realized by a frequency modulated signal. Thus, if the VCO 300 in FIG. 3 were modulated with a data bit of one polarity, a "mark" frequency ($f_m$) incrementally larger than the VCO frequency would result. If it were modulated with a data bit of the other polarity, a "space" frequency ($f_s$) incrementally smaller than the VCO frequency would result. The output frequency could then consist of the mark frequency ($f_m = f_v + d$) or the space frequency ($f_s = f_v - d$) depending upon the input data. This output can be split as previously described and one signal path can be divided by a dual modulus divider 302. A divisor, N, can be selected when the data input to VCO 300 creates a mark frequency and a divisor, M, can be selected when the data input to VCO 300 indicates a space frequency. Proper selection of values for N and M will causes the data of modulation frequencies to be cancelled at the output of mixer 304. Thus, the mark frequency when added to the mark frequency divided by N in mixer 304 can be set equal to the space frequency plus the space frequency divided by M in order to solve for the divisors N and M.

$$fm + \frac{fm}{N} = f_s + \frac{f_s}{M}$$

$$(f + d)\left(1 + \frac{1}{N}\right) = (f - d)\left(1 + \frac{1}{M}\right)$$

(using the sum term at the mixer output)

$$f\left(1 + \frac{1}{N}\right) + d\left(1 + \frac{1}{N}\right) = f\left(1 + \frac{1}{M}\right) - d\left(1 + \frac{1}{M}\right)$$

$$f\left(\frac{1}{M} - \frac{1}{N}\right) = d\left(2 + \frac{1}{N} + \frac{1}{M}\right)$$

$$f(N - M) = d(2MN + M + N)$$

If N is chosen to be an integer larger than M, then:

$$N = M + t$$

and:

$$ft = d(2(M+t)M + 2M + t)$$

$$\frac{ft}{d} = 2M^2 + 2M(t+1) + t$$

$$M^2 + M(t+1) + \frac{t}{2}\left(1 - \frac{f}{d}\right) = 0$$

Then choosing the sum solution of the quadratic equation:

$$M = -\frac{(t+1) + \sqrt{(t+1)^2 + 2t((f/d) - 1)}}{2}$$

For example, if the data rate is 4800 bits per second, and the deviation (d) equals 1200 Hz, the additive integer (t) may be selected to be 2; then the divisor integer M equals 98, the divisor integer N equals 100, the unmodulated VCO frequency ($f_v$) equals 11.8788 MHz, the mark frequency ($f_m$) equals 11.8800 MHz, the space frequency ($f_s$) equals 11.8776 MHz, and the output of the mixer 304 is a constant 11.9988 MHz when the deviation is correct.

The above example assumes that the mark frequency and the space frequency remain constant. In a practical situation it is to be expected that the modulation sensitivity (that is, the amount of frequency change for a given amount of applied modulation signal) of the VCO 300 would change as external parameters such as temperature are changed. Therefore, it is likely in operation that the mark frequency will not exactly equal 11.8800 MHz and that the space frequency will not equal 11.8776 MHz exactly. The output of mixer 304, then, would not equal 11.9988 MHz but would be some frequency greater or less then 11.9988 MHz. This improper frequency is related to the amount that the mark frequency is above or below its nominal value and the amount that the space frequency is above or below its nominal value. Frequency discrimination at the output of mixer 304, then, can provide the information necessary to control a deviation control feedback loop.

Figure 4:
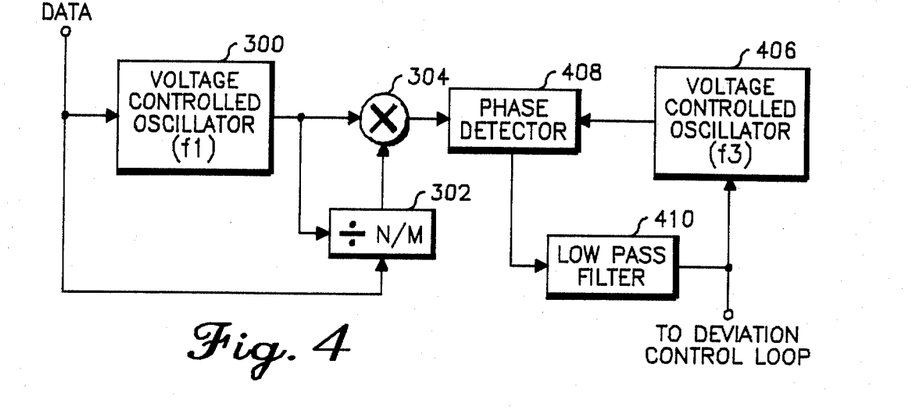
FIG. 4 is a block diagram of the frequency synthesizer of FIG. 3 wherein a conventional phase locked loop discriminator detects frequency shifts of the frequency shift synthesizer.

A phase locked loop may be arranged in a common discriminator configuration to provide a DC voltage proportional to frequency variation around a nominal value. Such an arrangement is shown in FIG. 4. In this diagram a second VCO, 406, oscillates at a frequency ($f_3$) equal to the output frequency of mixer 304. The output of VCO 406 is coupled to a standard phase detector 408 which compares the frequency of VCO 406 to the frequency of the output of mixer 304. The output of phase detector 408 is filtered by low pass filter 410 to create a DC or slowly varying voltage which, when applied to a VCO 406, changes the frequency ($f_3$) of the VCO 406 such that it remains equal to the frequency output of mixer 304. Thus, a voltage representative of the output frequency of mixer 304 is created at the output of low pass filter 410.

Figure 5:
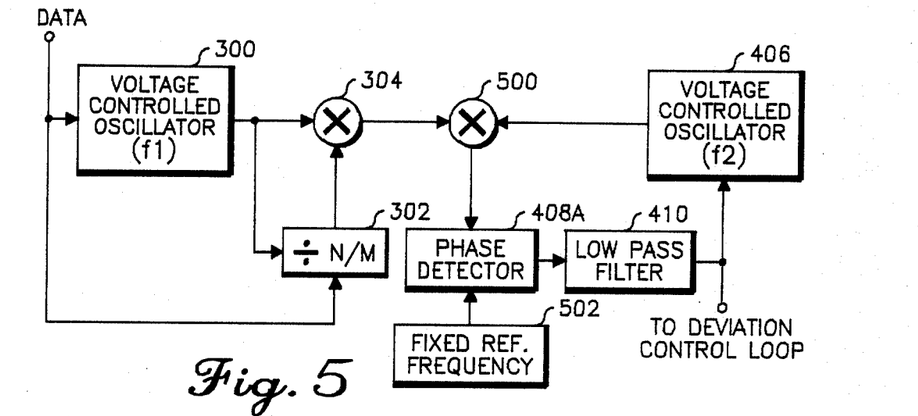
FIG. 5 is a block diagram of the frequency synthesizer of FIG. 4 modified to reduce the operational frequency of the phase locked loop discriminator.
Figure 6:
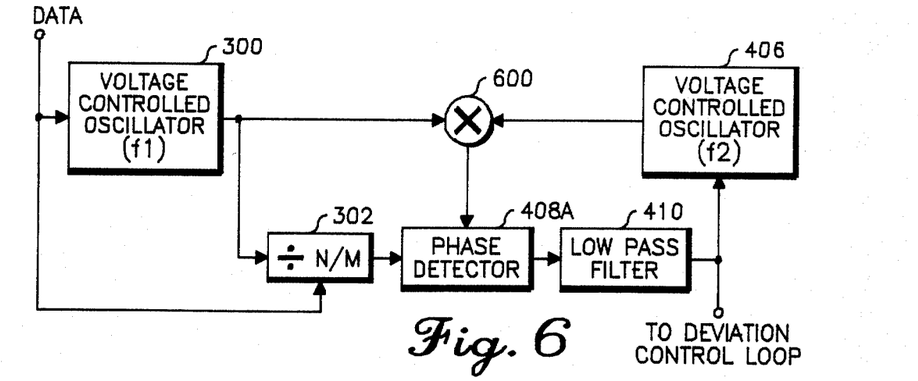
FIG. 6 is a block diagram of the frequency synthesizer of FIG. 5 wherein the dual mixers are combined into one.

In order to reduce the speed requirements of the phase detector 408, a lower frequency input may be obtained by using an additional mixer. This mixer is shown in FIG. 5 as mixer 500. In this situation the difference frequency between the output frequency of VCO 406 and the output frequency of mixer 304 is input to the lower frequency phase detector 408A and compared against an appropriate fixed reference frequency generated at 502. A further simplification results by moving the phase detector 408A to divider 302 output and, as shown in FIG. 6, replacing the two mixers 304 and 500 with a single mixer 600. Thus, the output of divider 302 becomes the appropriate fixed reference frequency for phase detector 408A and provides an expected frequency for both the mark frequency and the space frequency. These expected frequencies are subsequently compared to the difference of the data modulated frequency of VCO 300 and the frequency ($f_2$) of VCO 406 in phase detector 408A to create the conventional DC output control voltage from low pass filter 410 which can be used in the present invention to control the deviation level. From the previous example where t=2 and M=98, the frequencies realized at the phase detector 408A become 118.8 KHz for the mark frequency and 121.2 KHz for the space frequency.

Figure 7:
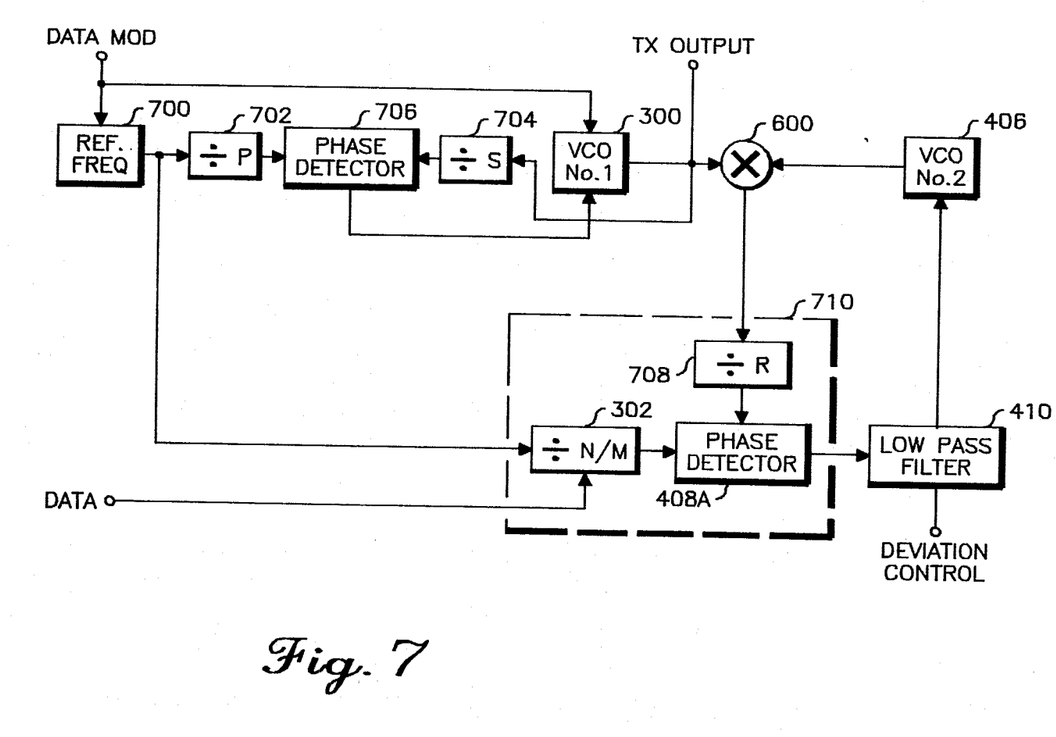
FIG. 7 is a block diagram of a modulated frequency synthesizer incorporating the modulation cancelling and deviation error detection aspects of the present invention.

When the circuit of FIG. 6 is implemented in a practical transmitter, it can be seen from FIG. 7 that the VCO 300 is the prime generator of the transmitter output frequency or the precursor output frequency which may subsequently be frequency multiplied to realize the transmitter output frequency. The VCO 300 is frequency stabilized by comparison to a stable reference frequency oscillator 700 which traditionally is a temperature compensated crystal oscillator and performs essentially the same function as stable frequency source 104 of FIG. 1. The reference frequency oscillator output is divided by a divider 702 of modulo P and the output frequency of VCO 300 is divided by divider 704 of modulo S. These lower frequencies are compared by phase comparator 706 and returned to VCO 300 in an traditional frequency synthesizer phase locked loop.

An additional divider 708 may be inserted at the output of mixer 600 for convenience of circuit design and is not critical to the operation of the preferred embodiment. The dual modulus divider 302, the phase detector 408A, and the ÷R divider 708 may be realized as a single integrated circuit, 710, which may be similar to an MC 145151 manufactured by Motorola Inc. The data to be modulated is applied both to VCO 300 and to the reference frequency oscillator 700 in order to modulate the transmitter output frequency. Both are modulated because the data may contain low frequencies which can be tracked by the VCO 300 Phase locked loop and thereby distorted. Unfiltered data is applied to dual modulus divider 302 thereby distinguishing mark and space frequency.

Figure 8:
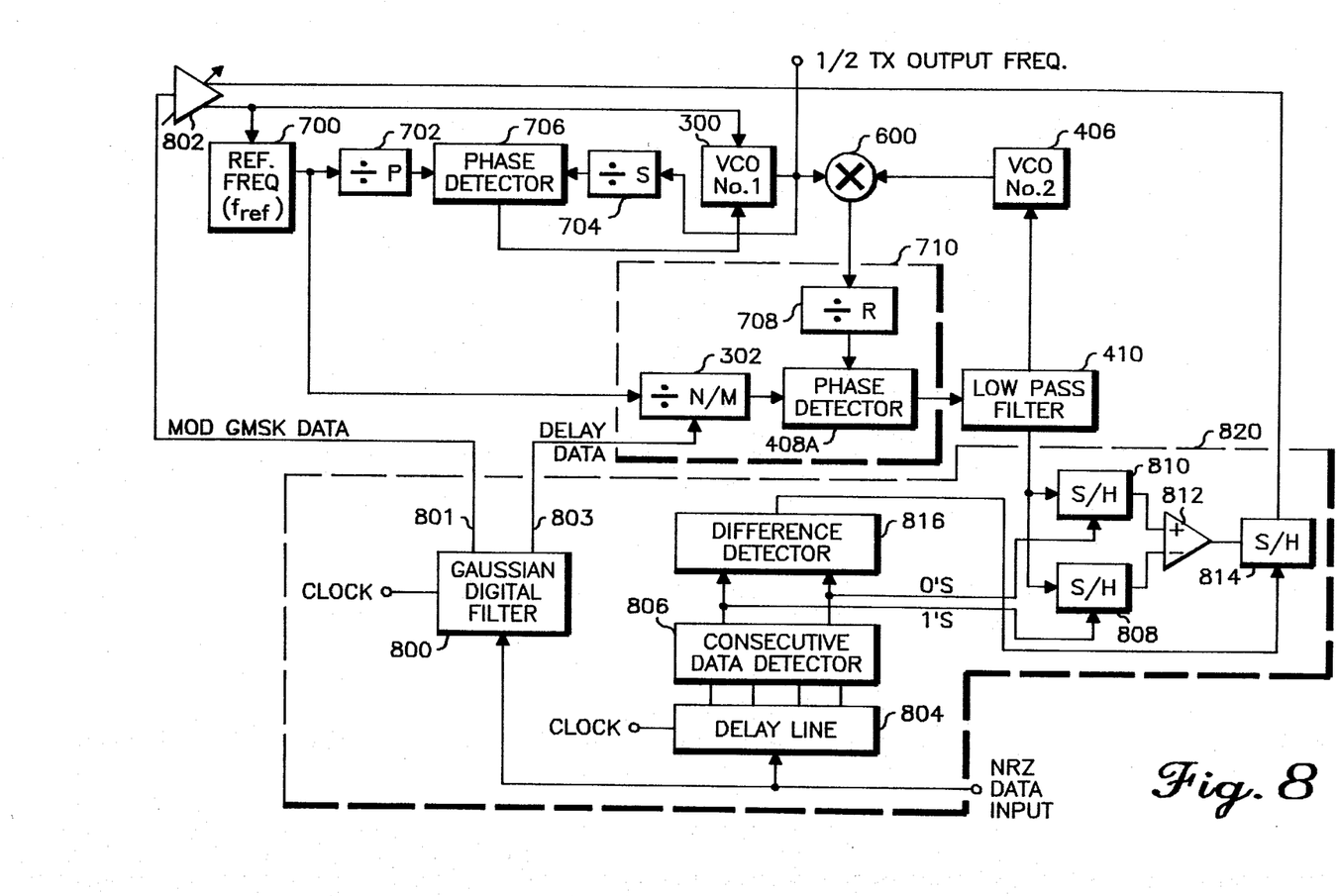
FIG. 8 is a detailed block diagram of the angle modulator, including the modulated frequency synthesizer of FIG. 7, and sampling and deviation control aspects of the present invention.

The preferred embodiment employs GMSK as the data modulation technique. Unfiltered MSK is rarely transmitted since it has a higher spectrum occupancy than GMSK. The Gaussian filter in the preferred embodiment is realized as a finite-length impulse response (FIR) filter since the data input is NRZ data. FIR filters are well known by those skilled in the art and are extensively described in the literature. This type of filter can be made phase linear and will not vary with age or temperature. The degree of filtering of the filter is expressed as the ratio of the 3 dB low pass cutoff to the bit rate, for example, 0.2 GMSK. This filter 800 is shown in FIG. 8 and produces two outputs from the NRZ input data. The fully filtered data, having a smooth waveform common to GMSK, is applied via modulated GMSK data output 801 to variable gain amplifier 802 and thence to the VCO 300 and reference frequency oscillator 700. The second output 803 (delay data) from the FIR Gaussian digital filter 800 retains the "one" and "zero" data levels while delaying the data bits by the average amount of delay experienced by the GMSK output 801. This second output 803 is applied to dual modulus divider 302 and establishes an "expected" mark or space frequency.

Lower design cutoff frequencies require more bits in the FIR Gaussian digital filter 800 internal registers. This implies that the instantaneous modulation frequency will not approach the true mark and space frequencies until the internal registers of the FIR filter have been filled with a number of consecutive "ones" or "zeros" equal to the length of the register. It is only at this time, when the Gaussian digital filter 800 has been input a sequence of consecutive "ones" or consecutive "zeros", that the output of low pass filter 410 should be sampled for a DC level representative of mark or space frequency. At those times when the Gaussian digital filter 800 has not seen the predetermined number of consecutive "ones" or "zeros" the VCO 300 will not have achieved either the mark or the space frequency and a proper deviation level cannot be determined.

The low pass filter 410 output is sampled only after sufficient consecutive bits occur to fill the Gaussian filter 800 internal delay. In order to accomplish this, a delay line 804 having four bits equivalent to the internal register of Gaussian filter 800 of the preferred embodiment also samples the NRZ input data. A consecutive data detector 806 monitors the consecutive bits in delay line 804 and provides a detect if all-ones fill the delay line 804 and a detect if the delay line 804 contains all zeros. The all-ones detect is coupled to sample and hold 808 (which may be an AD582 manufactured by Analog Devices) which samples and holds the voltage at the output of low pass filter 410. As described earlier this voltage is proportional to the difference in expected modulation frequency and the actual modulation mark frequency. The all-zeros detect is coupled to the sample and hold circuit 810 (which also may be an AD582 manufactured by Analog Devices) which samples the voltage equivalent to the difference frequency of a modulated space frequency. The output of sample and hold circuits 808,810 are coupled to a comparator 812 thereby producing an output which is equivalent to the difference of sample and hold output 808 and sample and hold output 810. This comparator may be an internal comparator integrated with a sample and hold circuit such as an AD582 manufactured by Analog Devices. The comparator 812 output itself is sampled by sample and hold circuit 814 which is gated by an all ones and all-zeros difference detector 816 thereby causing a new sample to be taken when a new all-ones or all-zeros detect occurs.

Figure 9:
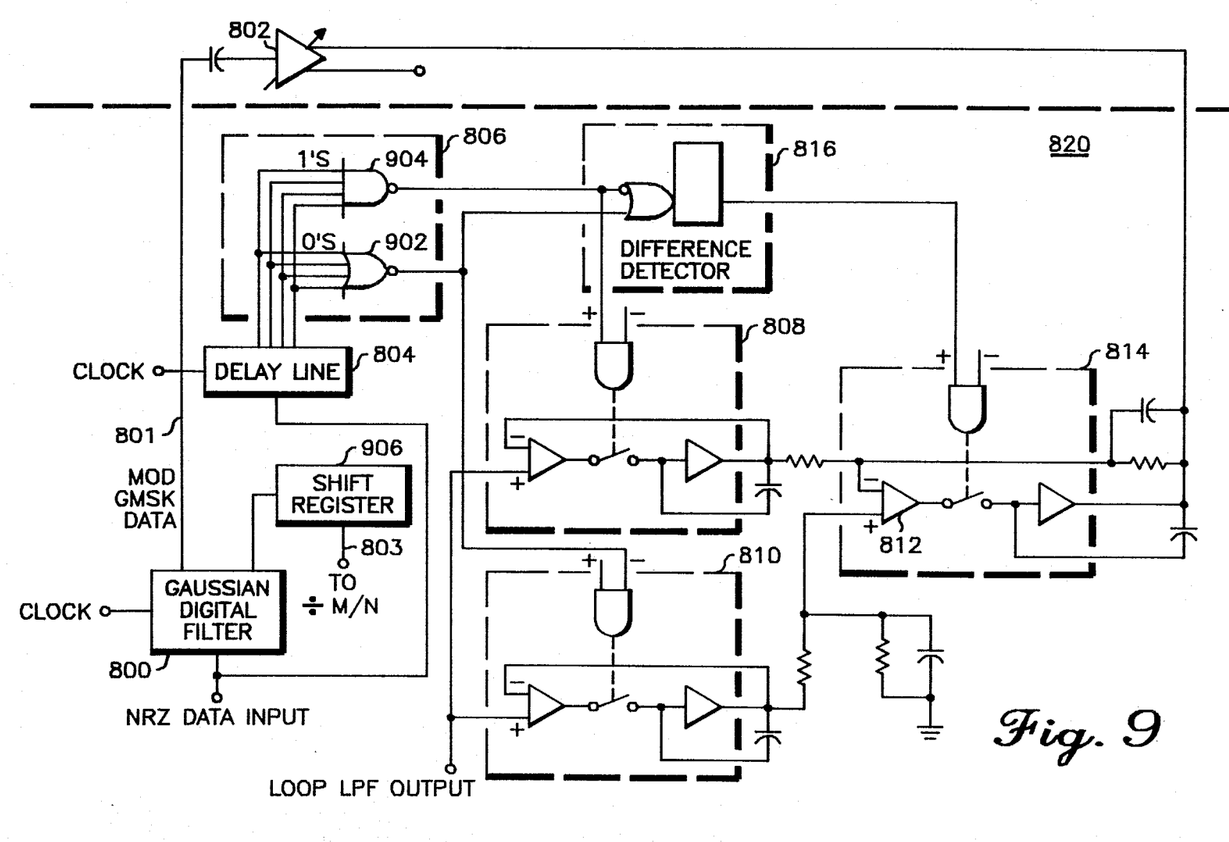
FIG. 9 is a detailed block diagram of the sampling and deviation control circuitry employed in the present invention.

The data filtering, detecting, and sample and hold circuits (820) used in the preferred embodiment may be examined in more detail in FIG. 9. The NRZ data to be transmitted is input to the Gaussian digital filter 800 and to the delay line 804 which may be an MC 14015B dual 4-bit static shift register manufactured by Motorola Inc. or equivalent. When four consecutive bits of data, which are each zero, appear on the output ports of delay line 804, a multiple input NOR 902 in consecutive data detector 806 provides an all-zeros output signal. NOR 902 may be a CMOS 8-input NOR like an MC 14078B manufactured by Motorola Inc. or equivalent. Likewise, when four consecutive bits are each one on the ouput ports of delay line 804, a multiple input NAND 904 (which may be a CMOS 8-input NAND like an MC 14068B manufactured by Motorola Inc.) in consecutive data detector 806 provides an all-ones output signal.

The all-zeros signal is applied to the negative edge input gate of sample and hold circuit 810. Thus the DC value of the $VCO_2$ loop control voltage is sampled at the time when four consecutive zeros have been applied through Gaussian digital filter 800 to the modulator. Four consecutive zeros cause the maximum instantaneous deviation in one direction of the carrier frequency and correspond to the space frequency.

The all-ones signal is applied to the positive edge input gate of sample and hold circuit 808. Similarly the DC value of the $VCO_2$ loop control voltage is sampled at the time when four consecutive ones have been applied through Gaussian digital filter 800 to the modulator. Four consecutive ones cause the maximum instantaneous deviation in the opposite direction from four zeros and correspond to the mark frequency.

The all-zeros signal and the all-ones signal are applied to opposite edge trigger input ports of the difference detector 816, which may be an MC 14528B dual retriggerable/resettable monostable multivibrator manufactured by Motorola Inc. Each time one of the signals appears, a pulse is generated by the difference detector 816 and coupled to the positive edge input gate of sample and hold circuit 814. In this way, the output feedback level is updated every time an all-zeros or all-ones four bit pattern occurs. The all-zeros sample and the all-ones sample are input to the comparator 812 to obtain a difference signal which is sampled by the remainder of sample and hold circuit 814. The output of sample and hold 814 is applied to the data modulation amplifier 802. This amplifier 802, which may be an MC 3340 manufactured by Motorola Inc., is a controlled-gain amplifier having a gain related to the value of the sample and hold 814 output. Thus the gain of amplifier 802 and the subsequent modulation deviation level is either decreased or increased in accordance with the frequency difference detected in phase detector 408A.

The output 803 of Gaussian digital filter 800 which is applied to the dual modulus divider 302 is first coupled to a variable length shift register 906 (which may be an MC 14557 1 to 64 variable length shift register manufactured by Motorola Inc.) for improved resolution of the delay of data over that provided by the FIR filter thereby delaying the data by the same amount as the multi-level GMSK data output on 801 from Gaussian digital filter 800. Thus the dual modulus divider 302 is synchronized with the modulated data.

Referring again to FIG. 8, the values of the mark frequecny, the space frequency, and the divider values for a particular exemplary embodiment can be developed as follows:

The relation between the carrier frequency precursor ($f_1$) and the reference frequency ($f_{ref}$) is given by:

$$\frac{f_1}{S} = \frac{f_{ref}}{P}; \frac{f_{ref}}{f_1} = \frac{P}{S}$$

When modulation is applied to $VCO_1$, 300 and the reference 700, the frequency of $VCO_2$, 406, ($f_2$) can be established as:

mark $f_{2m} - f_{1m} = R (f_{ref} + d(P/S))/N$
space $f_{2s} - f_{1s} = R (f_{ref} - d(P/S))/M$ -continued if: $f_{1m} = f_{1s} + 2d$, then:
$2d = R\,((f_{ref} - d(P/S))/M - (f_{ref} + d(P/S))/N)$
$= R\,(f_{ref}((1/M) - (1/N)) - d(P/S)((1/M) + (1/N)))$ which can be rewritten:
$d(2 + R(P/S)((1/M) + (1/N))) = Rf_{ref}((1/M) - (1/N))$ $$\frac{f_{ref}}{d} = \frac{1}{R}\,\frac{2 + R(P/S)((N + M)/NM)}{(N - M)/NM} =$$

$$\frac{2MN/R + (P/S)(N + M)}{N - M}$$

If the interger "1" is selected as the increment between the divider ratios M and N, $$N = M + 1$$

then $$\frac{f_{ref}}{d} = \frac{2(M^2 + M)}{R} + \frac{P}{S}(2M + 1)$$

$$\frac{2}{R}M^2 + \left(\frac{2}{R} + \frac{2P}{S}\right)M + \left(\frac{P}{S} - \frac{f_{ref}}{d}\right) = 0$$

thus $M =$ $$\frac{-\left(\frac{2}{R} + \frac{2P}{S}\right) \pm \left(\left(\frac{2}{R} + \frac{2P}{S}\right)^2 + \frac{8}{R}\left(\frac{f_{ref}}{d} - \frac{P}{S}\right)\right)^{\frac{1}{2}}}{4/R}$$

If the carier frequency is desired to be 814.000 MHz, then $f_1 = 407.000$ MHz. Choosing $f_{ref} = 14.4$ MHz:

$$\frac{P}{S} = \frac{f_{ref}}{407} = \frac{14.4}{407} = .035381$$

If R=8 (from the preferred embodiment of the integrated circuit 710), then the equation for M can be solved numerically: M=309.20. Therefore, let M=309.

$$N = M + 1 = 310$$

For spectrum occupancy purposes, the deviation (d) for 4.8KBS MSK data is selected to be ±1.2 KHz at 814 MHz (±600 Hz at 407 MHz).

The frequency at the phase detector 408A is constrained by the phase locked loop to be $f_{ref} \div M$ or N. Since the reference is modulated, this frequency becomes:

$$\text{mark } \frac{f_{ref} + d(P/S)}{M} = \frac{14,400,000 + 600(.035381)}{310} = 46,451.6814$$

$$\text{space } \frac{f_{ref} + (P/S)}{N} = \frac{14,400,000 + 600(.035381)}{309} = 46,601.8730$$

The difference between mark and space frequencies at the phase detector 408a is then:

$$46,451.6814 - 46,601.8730 = 150.1916 \text{ Hz}$$

This difference can be compared to the expected deviation of the carrier precursor for mark and space: (407,000,600 MHz − 406,999,400 MHz = 1200 Hz):

$$\frac{8(150.1916) - 1200}{1200} = .128\%$$

Thus the deviation accuracy in this embodiment of the present invention is maintained at 0.128%. It can be seen that no special relationship must be present between that bit rate, the deviation value, and the carrier frequency. Each may be established by constraints external to the present invention and the control of the deviation amount will be maintained by the present invention.

While a particular embodiment of the present invention has been shown and described, it should be understood that the invention is not limited thereto, for modifications of form may be created by those skilled in the art without departing from the true spirit and scope of the basic underlying principles of the present invention. It is therefore contemplated to cover by the present application any and all such modifications to the present invention disclosed and claimed herein.

We claim:

1. An automatic deviation control circuit for an angle modulated data transmitter employing a radio carrier comprising:
    means for angle modulating a precursor of the radio crrier to a deviation value having a proportionality to a data input level derived from at least one data bit;
    means for indicating a first difference between said carrier precursor deviation value and a predetermined positive deviation value when a data bit is at a first binary level, and for indicating a second difference between said carrier precursor deviation value and a predetermined negative deviation value when a data bit is at a second binary level;
    means for detecting a predtermined non-unity number of consecutive like-level data bits;
    means for sampling said first difference when said predetermined number of consecutive data bits of said first binary level is detected and for sampling said second difference when said predetermined number of consecutive data bits of said second binary level is detected; and
    means for varying said proportionality of said radio carrier precursor deviation value to said data input level in accordance with said first and second difference samples, thereby controlling the deviation of the angle modulated transmitter.

2. An automatic deviation control circuit in accordance with claim 1 wherein said means for varying said proportionality of said radio carrier precursor deviation further comprises means for comparing said first difference sample to said second difference sample.

3. An automatic deviation control circuit in accordance with claim 2 wherein said means for comparing said first difference sample to said second difference sample further comprises means for sampling and holding the output of said comparing means.

4. An automatic deviation control circuit in accordance with claim 1 wherein said means for varying said proportionality of said radio carrier precursor deviation value to said data input level further comprises a variable gain amplifier.

5. An automatic deviation control circuit in accordance with claim 1 wherein said means for indicating said first difference and said second difference is a variable reference divider phase locked loop.

6. An automatic deviation control circuit for an angle modulated data transmitter employing a radio carrier comprising:
- means for angle modulating a precursor of the radio carrier to a deviation value having a proportionality to a data input level derived from a sequence of data bits;
- means for generating a first signal corresponding to a predetermined positive deviation value when a data bit is at a first binary level and for generating a second signal corresponding to a predetermined negative deviation value when a data bit is at a second binary level;
- means for comparing and detecting the difference between said carrier precursor deviation value and said first generated signal, and for comparing and detecting the difference between said carrier precursor deviation value and said second generated signal;
- means for counting a predetermined number of consecutive like-level data bits;
- means for sampling and holding in a first location said detected difference between said carrier precursor deviation value and said first generated signal when said counting means counts a predetermined number of consecutive bits of said first binary level;
- means for sampling and holding in a second location said detected difference between said carrier precursor deviation value and said second generated signal when said counting means counts a predetermined number of consecutive bits of said second binary level;
- means for comparing said first and second location samples; and
- means for varying said proportionality of said carrier precursor deviation value to said data input level in accordance with said first and second location sample comparison thereby controlling the deviation of the angle modulated transmitter.

7. An automatic deviation control circuit in accordance with claim 6 further comprising means for sampling and holding said comparison of said first and second location samples.

8. An automatic deviation control circuit in accordance with claim 6 wherein said means for varying said proportionality of said carrier precursor deviation value is a variable gain amplifier.

9. A method of controlling the deviation of an angle modulated data transmitter employing a radio carrier comprising the steps of:
- angle modulating a precursor of the radio carrier to a deviation value having a proportionality to a data input level derived from at least one data bit;
- indicating a first difference between said carrier precursor deviation value and a predetermined positive deviation value when a data bit is at a first binary level, and indicating a second difference between said carrier precursor deviation value and a predetermined negative deviation value when a data bit is at a second binary level;
- detecting a predetermined non-unity number of consecutive like-level data bits;
- sampling said first difference when said predetermined number of consecutive data bits of said first binary level is detected and sampling said second difference when said predetermined number of consecutive data bits of said second binary level is detected; and
- varying said proportionality of said radio carrier precursor deviation value to said data input level in accordance with said first and second difference samples.

10. A method in accordance with claim 9 wherein said step of varying the proportionality of said radio carrier precursor deviation further comprises the step of comparing said first difference sample to said second difference sample.

11. A method in accordance with claim 10 wherein said step of comparing said first difference sample to said second difference sample further comprises the step of sampling and holding the comparison.

* * * * *